(12) United States Patent
Tustaniwskyj (10) Patent No.: US 10,782,316 B2
(45) Date of Patent: Sep. 22, 2020

(54) SOCKET SIDE THERMAL SYSTEM

(71) Applicant: Delta Design, Inc., Poway, CA (US)

(72) Inventor: Jerry Ihor Tustaniwskyj, Mission Viejo, CA (US)

(73) Assignee: DELTA DESIGN, INC., Poway, CA (US)

( * ) Notice: Subject to any disclaimer, the term of this patent is extended or adjusted under 35 U.S.C. 154(b) by 207 days.

(21) Appl. No.: 15/416,510

(22) Filed: Jan. 26, 2017

(65) Prior Publication Data

US 2018/0196084 A1     Jul. 12, 2018

Related U.S. Application Data

(60) Provisional application No. 62/444,092, filed on Jan. 9, 2017.

(51) Int. Cl.
    *G01R 1/04*      (2006.01)
    *G01R 31/28*      (2006.01)

(52) U.S. Cl.
     CPC ....... *G01R 1/0458* (2013.01); *G01R 31/2874* (2013.01)

(58) Field of Classification Search
     CPC .......................... G01R 1/0458; G01R 31/2871
     See application file for complete search history.

(56) References Cited

U.S. PATENT DOCUMENTS

| | | | |
|---|---|---|---|
| 4,739,258 A * | 4/1988 | Schwarz | G01R 27/02 324/537 |
| 5,164,661 A | 11/1992 | Jones | |
| 5,911,897 A | 6/1999 | Hamilton | |
| 6,184,504 B1 | 2/2001 | Cardella | |
| 6,362,640 B1 | 3/2002 | Wee | |
| 8,928,344 B2 * | 1/2015 | Rathburn | G01R 31/2889 324/756.03 |
| 2002/0075024 A1 | 6/2002 | Fredeman et al. | |
| 2004/0123968 A1 * | 7/2004 | Osanai | B22D 19/00 164/98 |
| 2005/0152663 A1 * | 7/2005 | Bench | G02B 6/4201 385/147 |

(Continued)

OTHER PUBLICATIONS

Roberts, J. et al. "Characterization of Microprocessor Chip Stress Distributions During Component Packaging and Thermal Cycling." IEEE Proceedings, Electronic Components and Technology Conference, 2010, pp. 1281-1295.

(Continued)

*Primary Examiner* — Dominic E Hawkins
(74) *Attorney, Agent, or Firm* — Foley & Lardner LLP (57) ABSTRACT

An integrated circuit device testing system includes a socket configured to receive an integrated circuit device, wherein the socket comprises at least one conductive trace made of a material with a resistivity that is a function of temperature, and wherein the socket is configured such that, when the integrated circuit device is located in the socket, the at least one conductive trace extends along a surface of the integrated circuit device. The integrated circuit device testing system further includes a controller or active circuit configured to determine a temperature at the surface of the integrated circuit device based on a measured resistance of the at least one conductive trace.

12 Claims, 9 Drawing Sheets

(56) References Cited

U.S. PATENT DOCUMENTS

| | | | |
|---|---|---|---|
| 2006/0173269 A1* | 8/2006 | Glossop | A61B 5/06 600/407 |
| 2006/0290370 A1 | 12/2006 | Lopez | |
| 2009/0002010 A1* | 1/2009 | Wong | G01R 31/2863 324/750.05 |
| 2009/0153171 A1* | 6/2009 | Lee | G01R 31/2874 324/750.09 |
| 2009/0197436 A1* | 8/2009 | Trobough | H01R 13/2442 439/67 |
| 2010/0007367 A1 | 1/2010 | Spielberger et al. | |
| 2013/0294041 A1* | 11/2013 | Syal | H05K 1/0275 361/764 |
| 2013/0300521 A1* | 11/2013 | Khine | H03H 9/02228 333/187 |
| 2016/0041220 A1* | 2/2016 | Leutschacher | G01R 1/0408 324/756.03 |

OTHER PUBLICATIONS

International Search Report and Written Opinion dated Jul. 25, 2018 in related Int'l Appl. PCT/US2018/012763 (19 pgs.).

\* cited by examiner

SOCKET SIDE THERMAL SYSTEM

CROSS REFERENCE TO RELATED APPLICATIONS

This application claims the benefit of US Provisional Application No. 62/444,092, filed Jan. 9, 2017; the entire contents of which are herein incorporated by reference in their entirety.

BACKGROUND

The present disclosure generally relates to a thermal sensor system for an integrated circuit ("IC") device testing system. In particular, the present disclosure relates to an IC device testing system that includes a temperature detector on a socket side of an integrated circuit device (also referred to as a "device under test" or "DUT") to measure a temperature of the DUT, and to an IC device testing system that includes socket side heating and cooling.

Temperature control during semiconductor testing is useful during processes such as device burn-in, functional testing, or system level testing ("SLT"). For temperature control, some form of temperature feedback may be useful. One type of feedback for temperature control is having direct temperature feedback ("DTF") with a temperature sensor in a chip located near a chip junction of interest. Such a sensor may not be located near a high power dissipation area, there can be limited access to it such as in between subtests of the test cycle, or such a sensor may simply not be available. If power is low and an adequate thermal interface material ("TIM") is used, it may be sufficient to use heater temperature feedback ("HTF"), where a heater on a thermal unit ("TU") is controlled to a set point temperature and an error of the junction temperature from set point is in an acceptable range.

When DTF is not available and the error with HTF is not acceptable, a number of other techniques may be employed. Heater temperature feedback with power following ("HTF-PF") is one such method. In HTF-PF, the temperature set point of a heater is modified dynamically as a function of measured device power and a known thermal resistance from the heater on the TU to the device junction. An extension of this technique is heater temperature feedback with dynamic power following (HTF-DPF) where the set point is modified due to the rate of change of device power in addition to device power. These power following techniques are used widely and produce good results but also have limitations.

SUMMARY

If the primary thermal path is not from a device to a TU, or if thermal resistance from the heater to junction varies greatly, then significant errors can occur using the above described methods. In many cases the measurement of device power may not be available or practical. At least some of the systems and methods described herein improve on the background art by measuring a temperature on a first, socket side of a DUT, rather than, or in combination with, measuring a temperature on a second side of the DUT opposite the socket side.

One method that does not use any feedback from the device is called extrapolated temperature feedback ("ETF"). Here the temperature of the device is estimated based on two temperature sensors in the TU as well as a rate of change of one of the sensors. This method can produce good results but there may not be enough room in the TU to include two sensors and there may also be significant errors if device to TU is not the primary thermal path or the thermal resistance from the heater to junction varies greatly. Another method used that does not use any feedback from the device is measuring a case temperature with a probe in the TU. Here the temperature measurement may use a commercially available sensor contacting the second side of the DUT. Drawbacks are that this may measure only a small portion of the second side, the set-up for the process is fragile, there may be a large varying thermal resistance at the contact point, significant space in the TU may be occupied, and contact area on the DUT needed for thermal control may be removed. It also is not practical to be used for devices where the majority of the power dissipation is near the socket side of the DUT.

Generally speaking, a DUT includes a plurality of contacts for external connection. The first "socket side" of the DUT refers to a side of a DUT that engages with a socket, or is in contact with a surface of the socket during testing, or is adjacent to a surface of the socket. In some embodiments, the socket side is a side on which a majority of the plurality of contacts of the DUT are disposed or from which the majority of the plurality of contacts of the DUT protrude. A side opposite the socket side is referred to as a second side of the DUT.

Currently, one way of implementing thermal control during testing of a device is to test and control a low power device in a temperature controlled chamber. However, if the device dissipates a power level that raises a junction temperature of the device above an acceptable level, this method may not be appropriate. Another problem is that controlled chamber designs have a limited throughput. Another way of implementing thermal control during testing of a device is to contact a surface opposite a socket side (e.g. a second side surface) with a TU to control a junction temperature. However, if a large component of a power dissipation of the DUT is near the socket side surface, this method may not be effective. Socket side thermal control is not typical in industry, and any such control is generally passive rather than active. One example is contactor conditioning, where an area near a socket is kept near a desired temperature set point to reduce heat transfer through a DUT socket side surface. This increases the accuracy of thermal control with a TU contact on the second side of the DUT.

Embodiments of the invention can be used for temperature sensing, such as in situations where the geometry of components of interest does not allow for standard off the shelf sensors or where temperature sensing of an area is needed that cannot be covered by a standard sensor.

Generally speaking, the locations that one can have access for temperature measurement on a DUT are on the second side, a space between the contacts of the DUT, or a separator strip devoid of contacts. There are problems associated with using a conventional temperature sensor to measure temperature at these locations. A thermocouple can measure only one small point, the contact thermal resistance at that point can be high yielding an erroneous temperature measurement, the thermocouple is fragile, and the wire types typically used are difficult to insulate and route, especially for test applications with high parallelism. Fitting in a thermistor or commercially available typical resistance temperature detector ("RTD") is not practical in all applications and if they are small enough, they share some of the shortcomings with the usage a thermocouple. Furthermore, any temperature sensor on the second side of the DUT may interfere with a mechanism used for thermal control. The various embodiments of RTDs described herein may overcome some or all of these problems.

In one embodiment, an integrated circuit device testing system includes a socket configured to receive an integrated circuit device, wherein the socket comprises at least one conductive trace made of a material with a resistivity that is a function of temperature, and wherein the socket is configured such that, when the integrated circuit device is located in the socket, the at least one conductive trace extends along a surface of the integrated circuit device. The integrated circuit device testing system further includes a controller or active circuit configured to determine a temperature at the surface of the integrated circuit device based on a measured resistance of the at least one conductive trace.

In another embodiment, an integrated circuit device testing system includes a socket configured to receive an integrated circuit device, the socket comprising a plurality of electrical contacts configured to contact electrical contacts of an integrated circuit device, a load board configured to electrically connect the electrical contacts of the socket to a controller or active circuit, and a thermal unit configured to heat and/or cool the integrated circuit device via at least the load board and the electrical contacts of the socket on a socket side of the integrated circuit device when the integrated circuit device is engaged with the socket.

In another embodiment, an integrated circuit device testing system includes a socket configured to receive an integrated circuit device, the socket comprising a plurality of electrical contacts configured to contact electrical contacts of an integrated circuit device. The integrated circuit device testing system further includes a thermally conductive substrate including thin film circuitry electrically connected to the electrical contacts of the socket, a load board electrically connected to the thermally conductive substrate via load board electrical contacts and configured to electrically connect the electrical contacts of the socket to a controller or active circuit, and a thermal unit configured to heat and/or cool the integrated circuit device on a socket side of the integrated circuit device while the integrated circuit device is engaged with the socket, via the thermally conductive substrate.

In another embodiment, an integrated circuit device testing system includes a flexible circuit board configured to receive an integrated circuit device, the flexible circuit board including a plurality of electrical contacts configured to contact electrical contacts of an integrated circuit device. The integrated circuit device testing system further includes a thermal interface layer disposed adjacent to the flexible circuit board, and a thermal unit disposed adjacent to the thermal interface layer, the thermal unit being configured to heat and/or cool the integrated circuit device on a socket side of the integrated circuit device while the integrated circuit device is engaged with the thermal unit.

In another embodiment, an integrated circuit device testing system includes a socket configured to receive an integrated circuit device, wherein the socket comprises a temperature-sensitive component which exhibits a temperature-dependent characteristic. The socket is configured such that, when the integrated circuit device is located in the socket, the temperature-sensitive component is in contact with a socket side surface of the integrated circuit device. The integrated circuit testing system further includes a controller or active circuit configured to determine a temperature at the surface of the integrated circuit device based on a measurement of the temperature-dependent characteristic of the temperature-sensitive component.

DETAILED DESCRIPTION

Embodiments of the present invention will be described below with reference to the accompanying drawings. It would be understood that the following description is intended to describe exemplary embodiments of the invention, and not to limit the invention.

Some of the systems, devices and methods described herein allow for sensing the temperature of a DUT on a socket side of the DUT, on which there are exposed contacts. In one embodiment, a socket side thermal sensing system for testing IC devices is configured to allow a sensed temperature to be used as feedback for a temperature control system. The socket side thermal sensing system includes a sensor designed to improve contact area to the DUT while reducing interference with contacts in a testing socket and thus reducing degradation of the electrical performance of the contacts. The socket side thermal sensing system allows the temperature of the DUT to be measured in real time. The DUT temperature can be controlled through thermal control on a socket side of the DUT. The socket side thermal sensing system can include sensor and/or control electronics within a testing socket. Some control electronics, such as a conditioning circuit for a thermal sensor, can be disposed in the socket or on a handler component that holds a TU and places the DUT in the socket. Placing control electronics in close proximity to the sensor can help to reduce noise and can significantly reduce a number of wires needed to connect the contacts of the DUT to a testing controller. The socket side thermal sensing system can include a resistance temperature detector ("RTD") that can comprise one or more conductive traces, or can comprise a flexible circuit board and at least one conductive trace. The traces of the RTD are configured to be on or near a surface of a printed circuit board ("PCB") in an area where an electrical component contacts the PCB.

System for Testing IC Devices

Figure 1A:
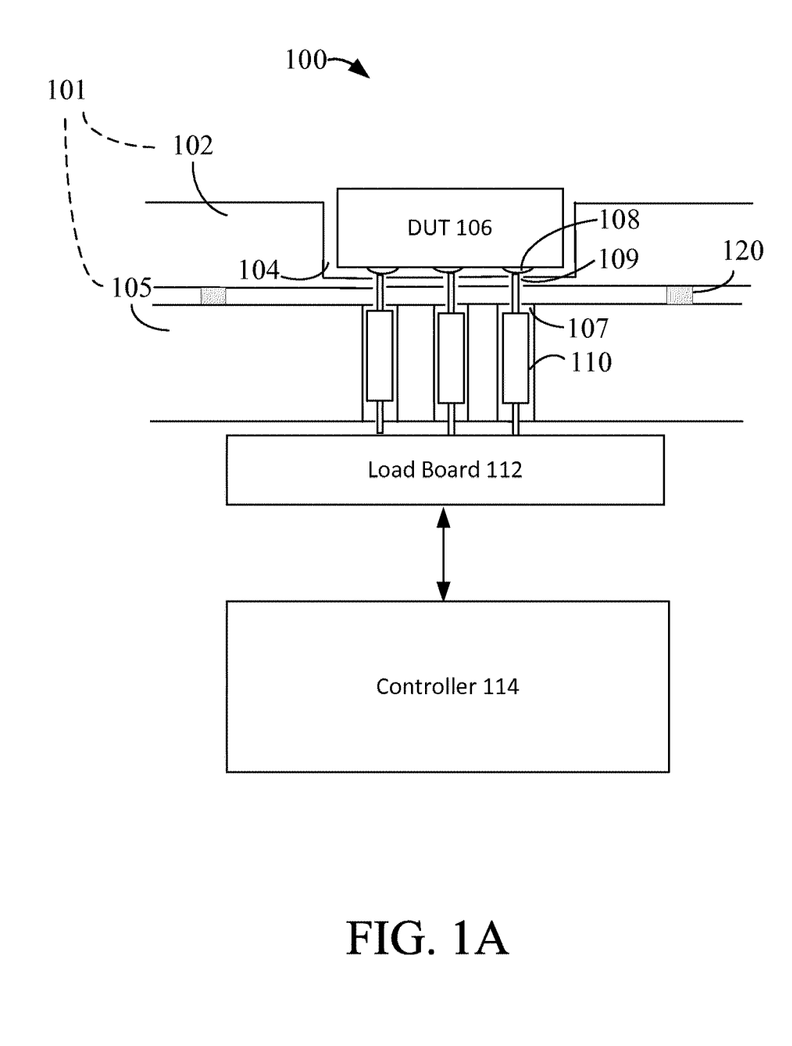
FIGS. 1A and 1B depict embodiments of a system 100 for testing IC devices.
Figure 1B:
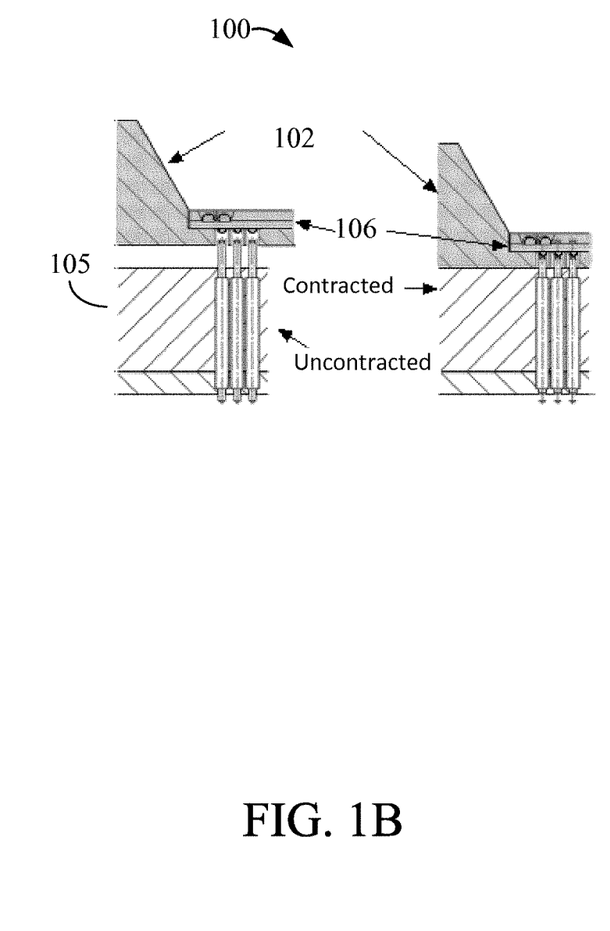

Referring to FIGS. 1A and 1B in general, FIGS. 1A and 1B depict embodiments of a system 100 for testing IC devices. The system 100 includes a socket 101, a load board 112, and a controller 114. The socket 101 includes a floating plate 102, a base member 105, and at least one spring 120. The floating plate includes a receptacle 104 and floating plate openings 109. The base member includes base member openings 107 and socket electrical contacts 110.

Referring to FIGS. 1A and 1B in more detail, the socket 101 depicted in FIG. 1 includes the floating plate 102. The floating plate 102 structurally supports a DUT 106, and includes a receptacle 104 for receiving the DUT 106. The floating plate 102 can be made of any appropriate material for structurally supporting the DUT 106, including a material suitable for withstanding any heat emitted by the DUT 106. The floating plate 102 can also be used to control the temperature of the device, and can be made from a thermally conductive but electrically insulating material such as AlN or anodized aluminum. The floating plate 102 is supported by the base member 105 via at least one spring 120, or by a plurality of springs 120. Use of springs is optional—in some embodiments, for example, a floating plate may be supported by pogo-pin type socket electrical contacts 110 which can compress when pressure is applied. The floating plate 102 comprises a plurality of floating plate openings 109 configured to allow electrical contacts 108 of the DUT 106 to electrically engage with the socket electrical contacts 110. As shown in FIG. 1B, the floating plate 102 is positioned over or rests upon contractible socket electrical contacts 110. The floating plate 102 and the socket electrical contacts 110 are configured such that the weight of the floating plate 102 is not sufficient to substantially compress the socket electrical contacts 110. The socket electrical contacts 110 "substantially compressing" may refer to the socket electrical contacts 110 contracting to the point where at least some of the DUT electrical contacts 108 are in contact with the socket electrical contacts 110. The floating plate 102 and the socket electrical contacts 110 are further configured such that, when the DUT 106 is inserted in the floating plate 102, and/or when pressure or force is applied on the floating plate 102, the socket electrical contacts 110 are in contact with the DUT electrical contacts 108. For example, the socket electrical contacts 110 may be configured to substantially compress when a mechanical device applies force on a top surface of the floating plate and/or DUT. This allows, for example, for smoothly inserting the DUT 106 in to plate tray 102, and for avoiding horizontal sheer between the contacts. The floating plate 102 may be so configured by selecting appropriate springs 120 or appropriate resilient socket electrical contacts 110, such as by selecting an appropriate number of springs or electrical contacts 110 which exert an appropriate resistive force when compressed.

In some embodiments, the floating plate 102 includes a receptacle 104. The receptacle 104 can be a recess in floating plate 102. In some embodiments, the receptacle is defined by a recess in a surface of the floating plate. In some other embodiments, the receptacle is a separate component from the floating plate 102 and can be disposed on or attached to the floating plate 102. The receptacle 104 can envelope all or part of a DUT 106 such that at least a part of a second side of DUT 106 remains exposed. The receptacle 104 can be shallower than the DUT 106 and is vertically extended, such that some of DUT 106 protrudes from the floating plate 102, as depicted in FIG. 1A. In other embodiments, the DUT 106 does not so protrude from the receptacle 104. The receptacle 104 comprises the floating plate openings 109 on a bottom or lower part of receptacle 104. Through the floating plate openings 109, the DUT electrical contacts 108 can come in to contact with the socket electrical contacts 110. In other embodiments, no receptacle 104 is used, and the floating plate 102 is configured to receive the DUT 106 on a surface of floating plate 102. In other embodiments, the floating plate 102 does not include a recess that serves as a receptacle, and the surface of the floating plate is substantially flat. In such embodiments, the DUT 106 may be placed on the flat surface for testing.

The socket 101 includes a base member 105. The base member 105 can serve as a structural support for the floating plate 102. The base member 105 includes base member opening 107 and socket electrical contacts 110. The base member opening 107 are configured to allow electrical contact between the socket electrical contacts 110 and the DUT electrical contacts 108.

For descriptive purposes, the DUT 106 may sometimes be referred to as part of the system 100 for testing IC devices, because it may be convenient to so refer to the DUT 106 when discussing testing configurations of system 100. However, the DUT 106 is not necessarily part of the system 100, and may be inserted or removed from system 100. Similarly, components of DUT 106, for example, the DUT electrical contacts 108, may be referred to as part of the system 100 for convenience, but are not necessarily part of the system 100. The DUT 106 may be inserted in to the receptacle 104 during testing. The DUT 106 may be any integrated circuit device. For example, the DUT 106 may be a package-on-package (POP) device, such as the device described below in reference to FIG. 2. The DUT 106 comprises the DUT electrical contacts 108. The DUT electrical contacts 108 allow the DUT 106 to establish an electrical connection with an electrical circuit, either directly or indirectly. The DUT electrical contacts 108 comprise a plurality of electrical contacts. The electrical contacts can be, for example, any combination of solder balls, pins, or contactor pads.

The base member comprises the socket electrical contacts 110. The socket electrical contacts 110 can serve as an electrical connection between the DUT electrical contacts 108 and a load board 112 or other electrical circuit, either directly or indirectly. The socket electrical contacts 110 are electrical contacts that may be, for example, any combination of pins, elastomeric conductors, or metallic "fuzz buttons." In some embodiments, the electrical contacts include contractible pins, such as those depicted in FIG. 1B. The contractible pins contract in the manner described above, such as when under load during testing. The socket electrical contacts 110 can protrude from the base member opening 107. At least some of the socket electrical contacts 110 can define at least a portion of a land grid array (LGA).

In some other embodiments, the socket 101 need not include all of, or any of, a floating plate 102, a base member 105, and a spring 120. Generally, the socket 101 may be anything in which, or in which, a DUT may be disposed or placed during testing. For example, the socket 101 may be an array of electrical contacts (e.g. elastomeric contacts or fuzz buttons) on which a DUT may be placed during testing.

The system 100 comprises a load board 112. The load board 112 can serve as an electrical intermediary between the DUT 106 or the socket electrical contacts 110 and another electrical circuit, either directly or indirectly. The load board 112 can be configured to be used in any manner appropriate for a load board, including for routing electrical signals received through the socket electrical contacts 110 to testing equipment for testing the DUT 106, and/or to the controller 114. The load board can also include logic circuitry. In some embodiments, the load board can communicate with the controller 114 wirelessly. In some embodiments, a flexible circuit board 902, depicted in FIG. 9 and described in more detail below, serves as a load board. The load board 112 need not serve only as an electrical intermediary, as described above for example, in some cases the load board 112 may act as a thermal conductor, or may provide structural support to components of system 100 or to other components.

In some embodiments, the system 100 comprises the controller 114. The controller 114 can be configured to process temperature information and/or to control at least one thermal unit, and can include any circuitry, logic system, central processing unit, application-specific integrated circuit suitable for any of those functions. For example, the controller 114 be configured to receive a signal indicative of a temperature of the DUT 106 (e.g. a signal indicative of a resistance of a RTD in contact with the DUT 106) and to output a signal to, for example, testing equipment or to a display, related to the temperature of the DUT 106, such as an integration of the DUT 106 temperature over a period of time, or a time average of the temperature, or a deviation of the temperature from a reference temperature, or a rate of change of the temperature. The controller 114 can additionally or alternatively be configured to control an active thermal unit that is configured to control a temperature of the DUT. Such control may or may not be based on a sensed or detected temperature of the DUT 106. For example, the controller 114 can implement a preprogrammed temperature control plan for a thermal unit, or can control a thermal unit and thereby cause a temperature of the DUT 106 to stay within a temperature range or above or below a temperature threshold, based on a sensed temperature of the DUT 106, such as by an RTD in contact with the DUT 106. The controller 114 can be located outside of the socket 101, or can be disposed on or integrated with, for example, any of the socket 101, the floating plate 102, the receptacle 104, the load board 112, or a thermal unit configured to control a temperature of the DUT 106.

Figure 2:
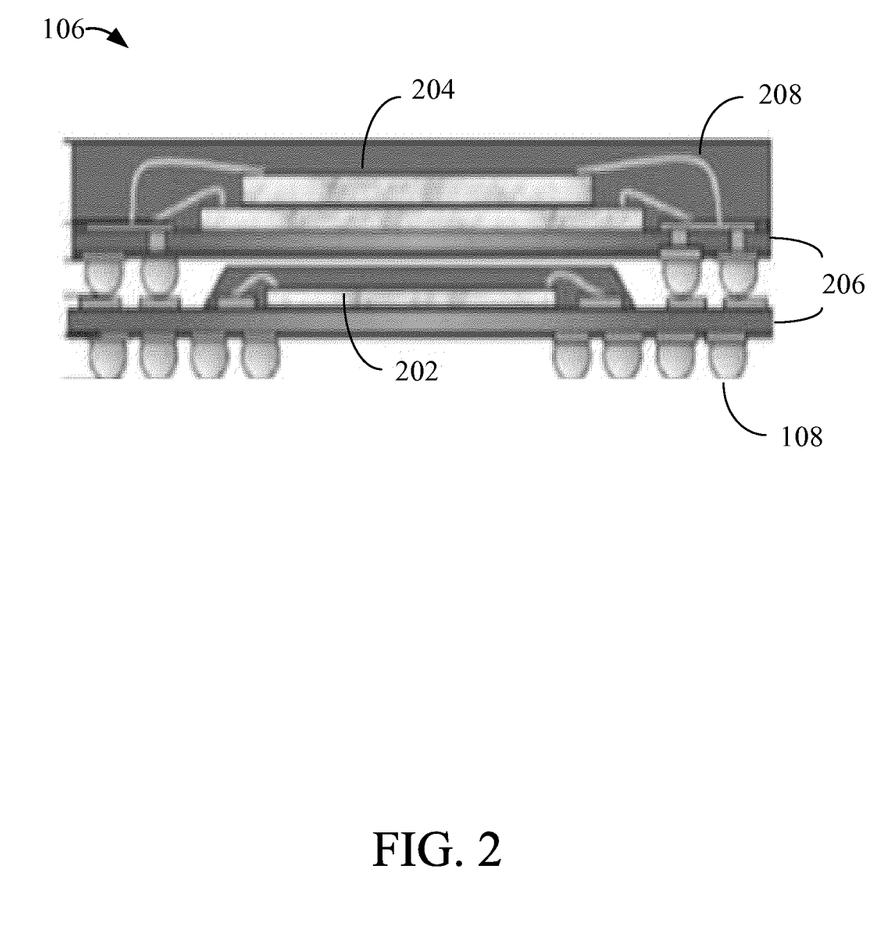
FIG. 2 depicts an embodiment of a package-on-package ("POP") type DUT.

FIG. 2 depicts an embodiment of a POP type DUT 106. This embodiment is one example of a DUT that can be tested using the systems and methods described herein. In the depicted embodiment, the DUT 106 is a POP device comprising the DUT electrical contacts 108, a logic die or processor 202, a plurality of stacked memory die 204, a plurality of substrates 206, and wire bonds 208. The logic die or processor 202, the plurality of stacked memory die 204, the plurality of substrates 206, and the wire bonds 208 may be conventional components typically found in a combination processor/memory device.

During testing, the POP type DUT 106 is placed on the floating plate 102 or is inserted in to the receptacle 104, and the DUT electrical contacts 108 are brought in to contact with the socket electrical contacts 110. The DUT 106 may be, for example, a dense memory device which includes a processor that serves as a memory controller. In the depicted embodiment, the processor 202 has more protruding contacts than does the stacked memory die 204. Additionally, the processor 202 dissipates more heat than the stacked memory die 204 during testing. As such, there may be a greater need for temperature sensing or temperature control on a processor 202 side of the DUT 106, which in this case is the socket side. In some configurations, there may also be an air gap above the processor 202, making second side cooling even less effective, especially in situations where the processor 202 emits a substantial amount of heat. Socket side temperature control can be helpful in solving these problems. In other embodiments, IC devices other than a POP type DUT may be tested using devices, systems and methods described herein, such as, for example, a quad-flat no-leads package device.

Temperature measurement (socket-side or otherwise) for active temperature control purposes, or for any other purpose, including any purpose described herein, can be implemented in any appropriate way, such as, for example, by use of an RTD, by use of a determination or measurement of a temperature-dependent forward voltage of a diode (e.g. a diode that is part of, or attached to, or otherwise integrated with, a DUT 106), or by any other temperature measurement system or method described herein.

Socket-side temperature sensing can be implemented using a sensor that is in thermal contact with the socket-side of the DUT 106. Such thermal contact can be, for example, direct contact (such as direct contact between the RTD 116 or another temperature sensor and the socket-side of the DUT), or thermal contact via, for example, any of: a load board, electrical contacts, a thermal interface, a flexible circuit board, thin-film circuitry, a socket of a testing system or any component of the socket, and/or thermal vias. Some exemplary socket-side sensing implementations are discussed below and describe using an RTD for temperature sensing, but any other appropriate type of temperature sensor may be used additionally or alternatively to the RTD sensor to detect a temperature of a socket-side of the DUT 106.

Resistance Temperature Detector

Figure 3A:
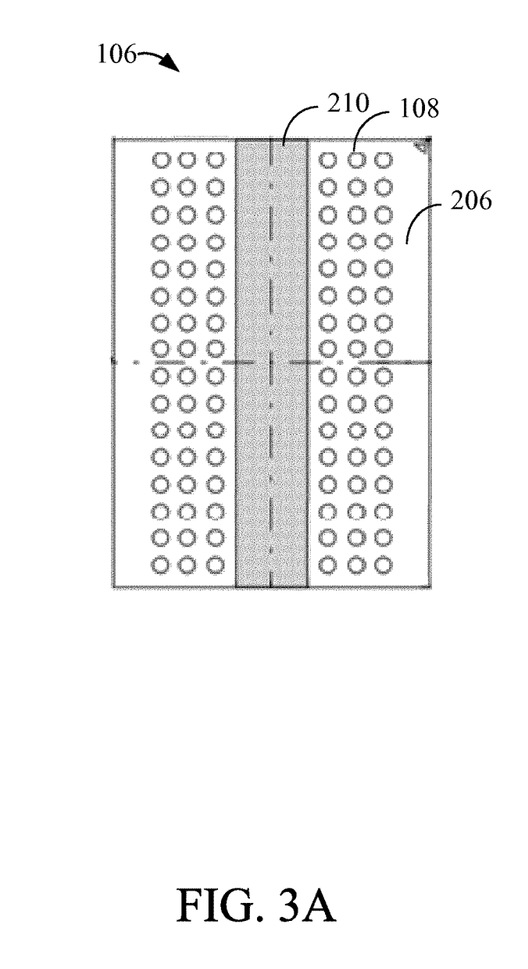
FIGS. 3A-3C depict an embodiment of a DUT, an embodiment of an RTD suitable for detecting a temperature of the DUT, and an embodiment of the RTD engaged with the DUT, respectively.
Figure 3B:
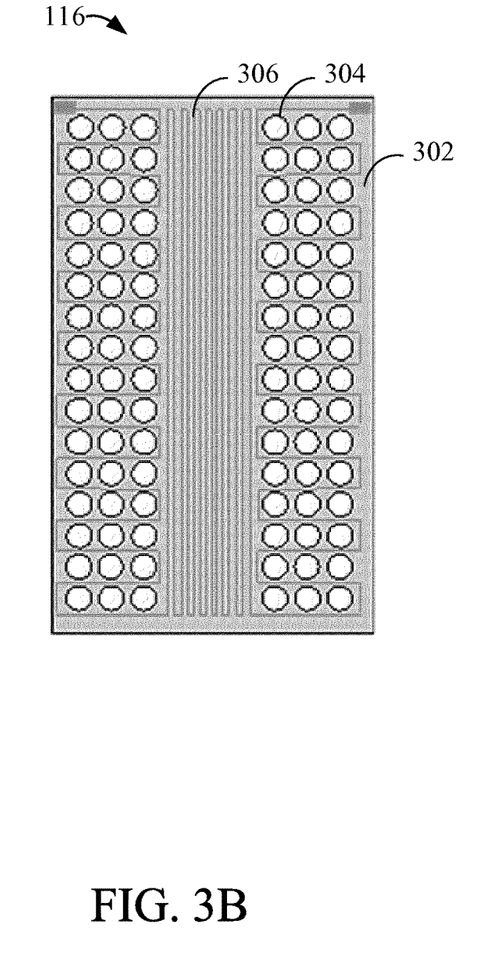
Figure 3C:
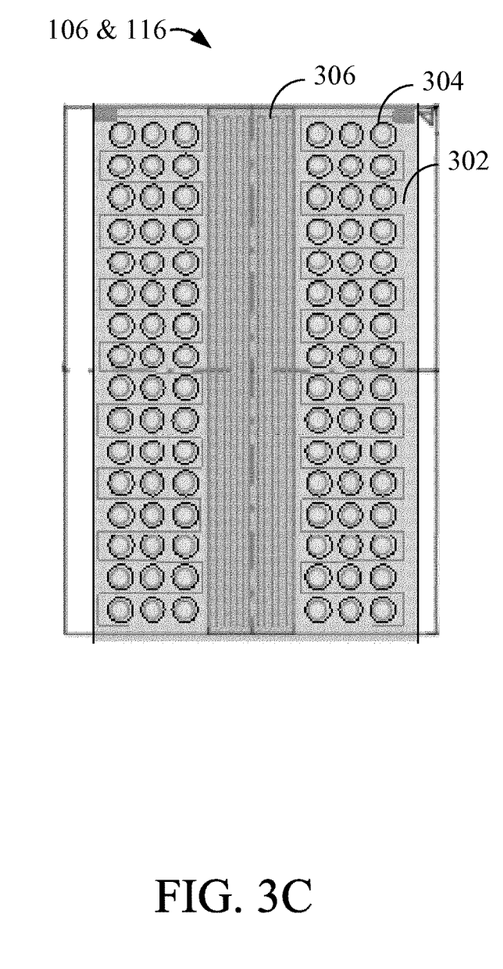
Figure 6A:
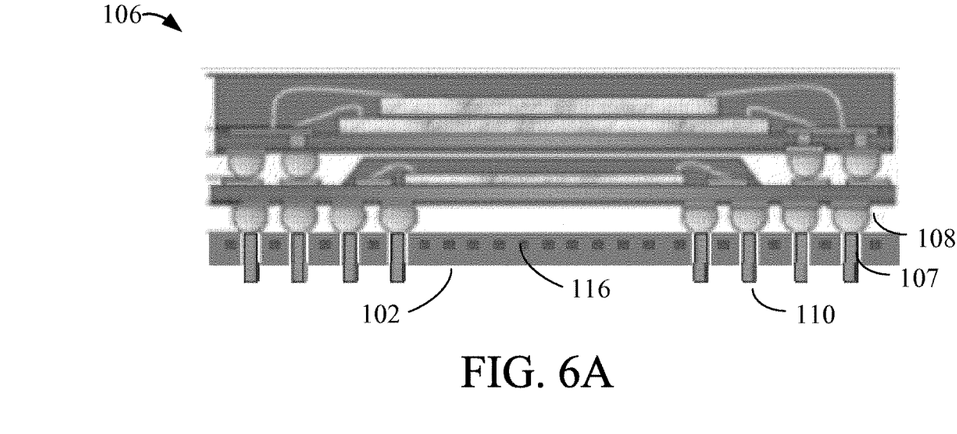
FIG. 6A depicts a DUT inserted in a socket of a test system with a multilayered floating plate, according to one embodiment.
Figure 6B:
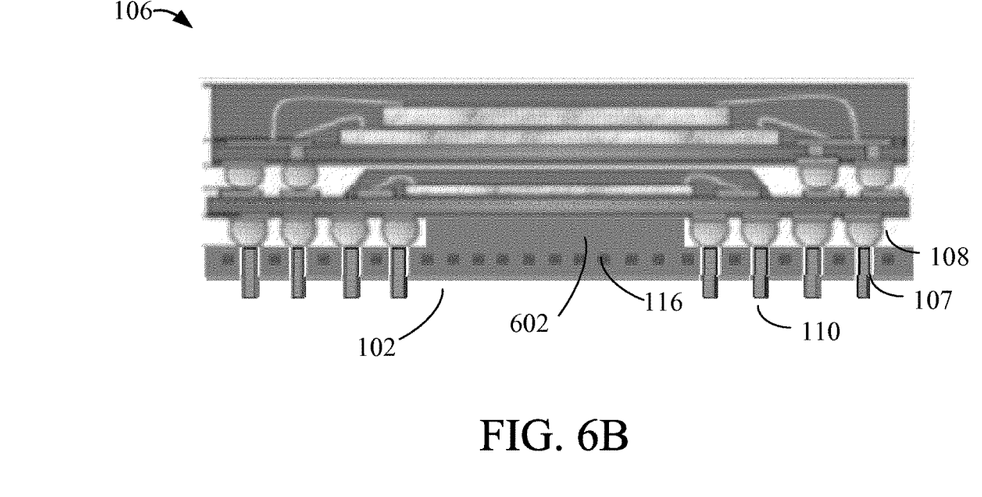
FIG. 6B depicts a DUT inserted in a socket of a test system with a multilayered floating plate having a heating/cooling slug, according to one embodiment.

Referring now to FIGS. 3A-3C generally, FIG. 3A depicts an embodiment of a DUT 106, FIG. 3B depicts an embodiment of an RTD 116 suitable for detecting a temperature of the DUT 106, and FIG. 3C depicts the RTD 116 engaged with the DUT 106. In some embodiments, the RTD 116 is located on a exposed surface of the floating plate 102, where it can be sandwiched between the floating plate 102 and the DUT 106. In other embodiments, the RTD 116 is integral to the floating plate 102, as depicted in FIGS. 6A and 6B.

FIG. 3A depicts an embodiment of a DUT 106 in which the DUT electrical contacts 108 are a solder ball array. The solder balls need not be spherical, semi-spherical, or even round in shape, and may be, for example, any conducting mounds or any other conducting protrusions protruding from the socket side surface of the DUT 106. The DUT 106 includes a substrate 206 which forms a majority of a socket side surface of the DUT 106. The DUT electrical contacts 108 protrude from substrate 206 of the DUT 106. In some embodiments, a protective layer or mask may cover the substrate 206. The embodiment of the DUT 106 depicted in FIG. 3A includes a separator strip 210 which is devoid of electrical contacts of the DUT electrical contacts 108. Such a strip may be found on many typical IC devices. Other embodiments do not include a separator strip 210. The solder ball DUT electrical contacts 108 are arranged in columns in the embodiment depicted in FIG. 3A.

FIG. 3B depicts an embodiment of a resistance temperature detector 116 for detecting temperature on the socket side of the DUT 106. In the embodiment depicted in FIG. 3B, the RTD 116 comprises a flexible circuit board 302, RTD openings 304, and a trace 306.

The flexible circuit board 302 comprises RTD openings 304 that allow electrical contact between the DUT electrical contacts 108 and the socket electrical contacts 110. The openings 304 can be oval, circular, or any other shape. An advantage of the depicted RTD 116 is that it increases contact with the socket side surface of the DUT 106 while still allowing the DUT electrical contacts 108 to engage with the socket electrical contacts 110. The openings 304 are arranged in columns that correspond to the columns of solder balls of the DUT 106. The trace 306 extends along a path between the openings 304. The path can be a meandering path, such that, for example, it can double back on itself and need not necessarily progress straight from one side of the RTD 116 to the other side of the RTD 116.

In one embodiment, the trace 306 comprises etched lines of any suitable conductive material with a known or determined (through e.g. calibration) relationship between resistivity and temperature. For example, the trace 306 can comprise etched copper lines. The etched lines can be made with very fine geometry. Copper has a resistivity that is a function of temperature, with a temperature coefficient of approximately +0.4% per degree Celsius (near room temperature). Thus, if the temperature of the copper increases by 1 degree Celsius, the resistance will increase by approximately 0.4%. The RTD 116 may be in thermal contact with the socket side of the DUT 106, and a measurement of the resistance of the RTD 116 or of the trace 306 may allow for calculation of an estimated temperature of the DUT based on a known or determined relationship between resistivity and temperature. Such a relationship can be, for example, specific to the trace 306 or to the material used for the trace 306. Generally speaking, the better the thermal contact between the RTD 116 and the DUT 106, the better the estimation of the temperature of the DUT 106. The embodiments of the RTD 116 described herein allow for good thermal contact between the RTD 116 and the DUT 106, and the RTD 116 can come in to thermal equilibrium with the socket side surface of the DUT 106, leading to better estimation of the temperature of the DUT 106. In some embodiments, the trace 306 is long so as to maximize a percentage of the trace 306 that is in contact with the DUT 106. The trace preferably has minimal cross-sectional area so as to increase the total resistance of the trace 306, which makes it easier to measure a change in resistance. The trace 306 can be configured such that, when the DUT 106 is located or disposed in the receptacle 104, the conductive trace extends along the socket side surface of the DUT.

The resistance of the RTD 116, or of the trace 306, which can be used to estimate the temperature of the DUT 106, can be measured in a number of ways. For example, the resistance of the RTD can be measured using a four wire Kelvin connection that connects, directly or indirectly, to a controller 114 or another measurement device. The RTD 116 can be connected directly to a controller configured to measure the resistance of the RTD 116 via transmission of an electrical impulse. The RTD 116 can be connected to the controller through the receptacle 104. The RTD 116 can be connected to the controller through a load board 112. In some embodiments, the RTD 116 can be connected, via a four wire Kelvin connection or other connection, to an active circuit located in the load board 112 or elsewhere in the socket (e.g., in the base member 105 or in the floating plate 102). This helps reduce the number of wires required to establish the connection. In other embodiments, if an active temperature sensor conditioning circuit is disposed near the DUT 106 (e.g. integrated with the socket 101 of a nearby thermal unit), a single wire can be used to transmit, for example, a voltage signal that is proportional to temperature to the active temperature sensor conditioning circuit. This can help to reduce a total number of wires needed and can help to reduce noise. In other embodiments, the RTD 116 can be connected, directly or indirectly, to a temperature control unit or device such as a heater or a fan.

In another embodiment, the system further comprises a thermal unit configured to heat and/or cool the integrated circuit device, and the thermal unit is configured to electrically connect the conductive trace of the RTD 116 to the controller.

In some embodiments, the trace 306 comprises copper. In other embodiments, another metal may be used. As copper has a somewhat low room temperature resistivity than some other metals, in some cases, it may be preferable to use a metal with higher room temperature resistivity than copper, as a percentage change in resistivity that accompanies a change in temperature may be easier to measure when the room temperature resistivity is higher. However, using copper may provide some advantages as compared to another metal because, for example, copper can be used in an inexpensive manufacturing process, and because the copper trace 306 may be made to be long, with a small cross-sectional area, to assure that a change in temperature can be measured despite copper's low room temperature resistivity.

In one embodiment, the trace 306 is etched or deposited on a surface of the RTD 116, the surface comprising, for example, anodized aluminum or a thin sheet of AlN. In some embodiments, the RTD 116 is integrated in a multilayered floating plate 102, as shown in FIGS. 6A and 6B, described in more detail below.

In some embodiments, the trace 306 is deposited on the printed circuit board 302 or another surface via ink jet printing. In other embodiments, components, such as one or more traces, of the socket 101 are created by 3D printing or stereo lithography.

FIG. 3C depicts the RTD 116 covering or engaging with or in contact with the DUT 106. FIG. 3 depicts contacts of the DUT electrical contacts 108 protruding from RTD openings 304. This depiction demonstrates that, even when the RTD 116 is in thermal contact with the DUT 106 and covers portions of the DUT 106, the DUT electrical contacts 108 can still engage with the socket electrical contacts 110. Furthermore, the RTD trace 306 covers the majority of the area of the socket side surface of the DUT 106. In other embodiments, the RTD trace 306 may cover less than the majority of the socket side surface of the DUT 106. For example, the RTD trace 306 can cover a percent of the socket side surface of the DUT 106 that falls within a range of 40% to 49%, inclusive, or within a range of 30% to 39%, inclusive, or within a range of 20% to 29%, inclusive, or within a range of 10% to 19%, inclusive. This is advantageous in that the more surface area is covered, the more quickly the trace 306 will come to thermal equilibrium with the DUT 106. This is additionally advantageous because different points of the socket side surface of the DUT 106 may be at different temperatures, and covering a large area of the socket side surface allows the trace 306 to come to an approximately average thermal equilibrium with the socket side surface, which can be useful in making temperature measurements of the DUT 106. Covering a large surface area can also be advantageous in that a larger surface area trace may result in a lower thermal resistance between the trace 306 and the DUT 106.

Figure 4A:
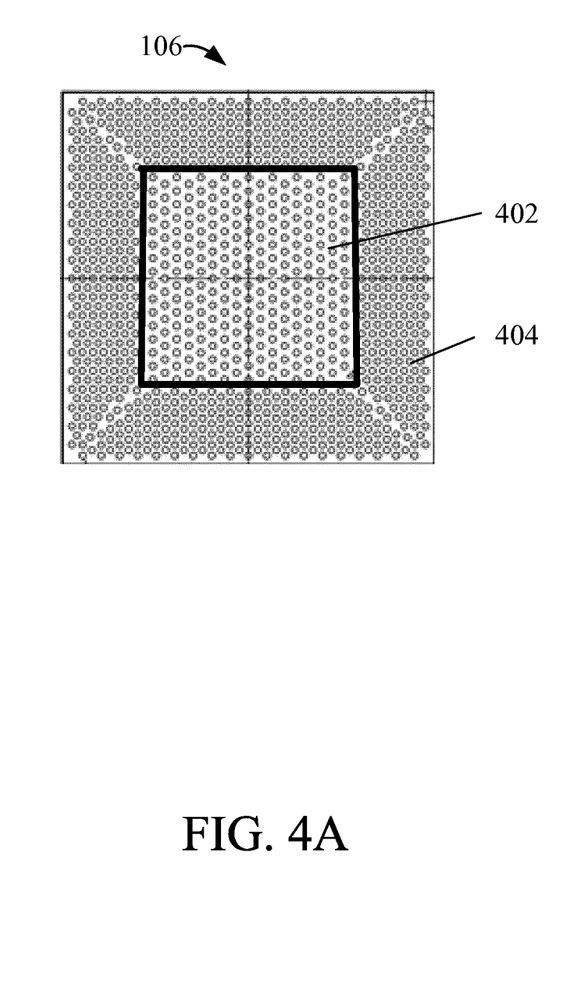
FIG. 4A depicts another embodiment of a DUT.
Figure 4B:
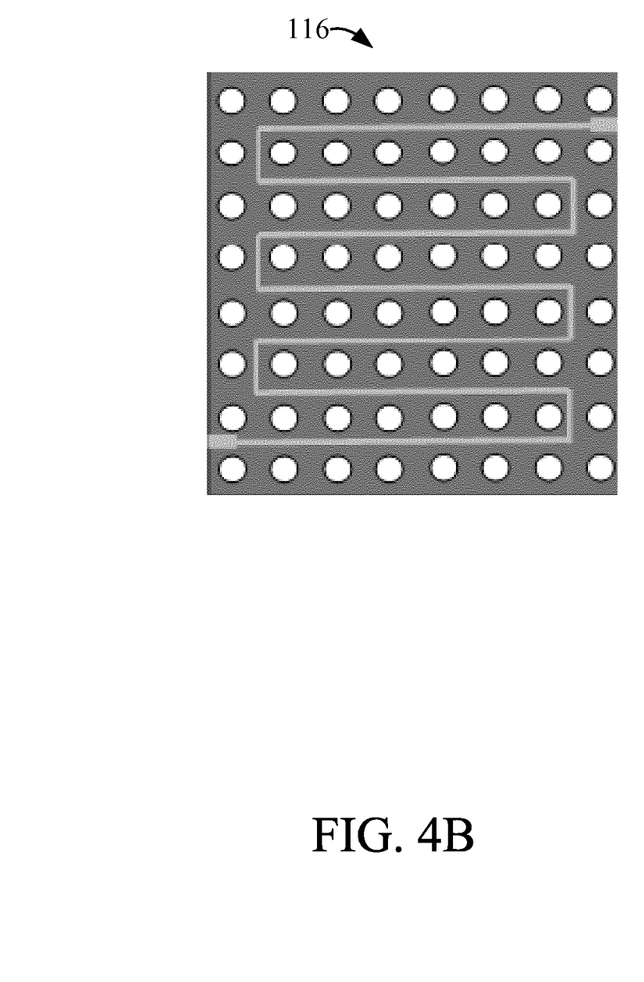
FIG. 4B depicts an embodiment of an RTD suitable for detecting a temperature of the DUT.

Referring to FIGS. 4A and 4B in general, FIG. 4A depicts another embodiment of a DUT 106, and FIG. 4B depicts another embodiment of an RTD 116 suitable for detecting a temperature of the DUT 106. FIG. 4B demonstrates an alternative embodiment of an RTD 116, customized to the DUT 106 depicted in FIG. 4A.

Referring to FIG. 4A in more detail, in the depicted embodiment, a socket side surface of the DUT 106 comprises a region of interest 402 and a region of disinterest 404. The region of interest 402 and a region of disinterest 404 can be defined in any appropriate manner. For example, the region of interest 402 may be defined by an area in which heat dissipation is high, or above a threshold percentage of total heat dissipation. It may be desirable, efficient or practical to measure temperature only in the region of interest 402 and not in the region of disinterest 404. For example, the region of interest 402 may correspond to a location of an IC device. The region of interest 402 may correspond to a location where discharge of a majority of the heat discharged by DUT 106 occurs, and thus measurement of the temperature of region of interest 402 may suffice for determining or estimating a temperature of the DUT 106. In the depicted embodiment, the region of interest 402 comprises a portion of the surface of the DUT 106 that is centrally located. The region of disinterest 404 comprises a portion of the surface of the DUT 106 that is peripherally located and surrounds the region of interest 402.

FIG. 4B depicts an embodiment of a customized RTD 116 that engages with the region of interest 402. This may be more efficient or more practical than an RTD 116 that covers an entire area of the socket side surface of the DUT 106. An RTD 116 may be customized in any appropriate manner, such as being integrated with a receptacle 104.

Temperature Control

Figure 5:
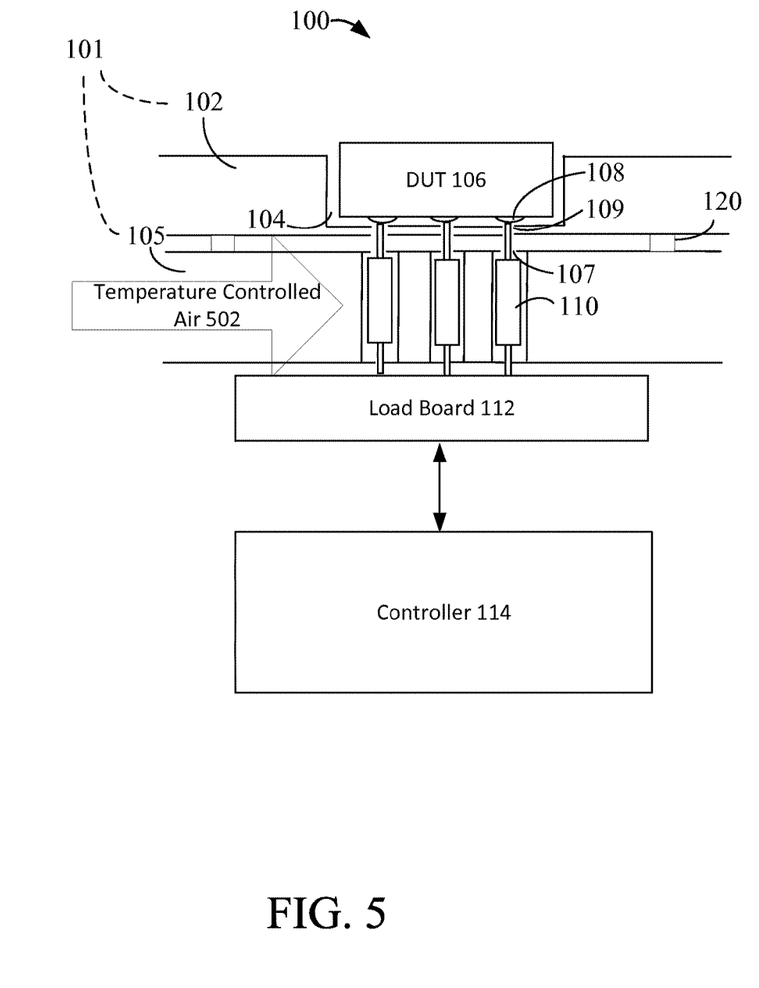
FIG. 5 depicts an embodiment of a system for testing IC devices with socket side temperature control.

FIG. 5 depicts an embodiment of a system 100 for testing IC devices with socket side temperature control. Such temperature control may allow for advantages such as those described above in reference to FIG. 2, in that a socket side portion of a DUT 106, such as a package-on-package device, may dissipate more heat than a second side portion of the DUT 106, making temperature control more effective on the socket side. Temperature control may be implemented in a variety of ways. As depicted in FIG. 5, temperature control can be implemented by providing temperature-controlled air to the socket electrical contacts 110 or to the socket side of the DUT 106. The base member 105 can be configured to allow for the temperature-controlled air 502 to pass over the socket electrical contacts 110. Alternatively, the temperature-controlled air 502 can be provided between the floating plate 102 and the base member 105. In other embodiments, temperature control can be provided in other ways, such as by other temperature controlled gas or liquid, or by contact with a temperature controlled material. The temperature-controlled air 502 may be provided by a thermal control component such as a fan. Other temperature control methods are discussed in more detail below. Any of these temperature control methods may be performed in combination with any other temperature control method, including in combination with any type of second side temperature control, active or passive, such as by a second side thermal unit.

In some embodiments, temperature control is implemented actively, in response to a measured or estimated temperature of the DUT 106. For example, if the temperature of the DUT 106 is measured to be above a pre-defined threshold, cooling is implemented, or if the temperature of the DUT 106 is measured to be below a pre-defined threshold, heating can be implemented.

In some other embodiments, socket side temperature control is implemented passively. The socket side temperature control can be active, passive, or a combination of the two (for example, active at some times, and passive at other times), and can be implemented in conjunction with active second side temperature control, passive second side temperature control, or any combination of the two. In some embodiments, active temperature control, on either the second side or the socket side of the DUT 106, is performed based on temperatures measured or estimated using the RTD 116. Active temperature control may also be implemented based on a combination of temperature measurements and temperature control techniques. For example, an active socket side temperature control system may control temperature based on a socket side measured temperature, such as a temperature measured using the RTD 116, in conjunction with an active second side temperature control system that may control temperature based on a second side measured temperature.

In some embodiments, active temperature control is implemented by connecting a RTD 116 to an active temperature controller, either directly or indirectly. For example, as described above in reference to FIGS. 3A-3C, the RTD 116 is connected to the active temperature controller via a four wire Kelvin connection, or any other appropriate connection. The RTD 116 may also be connected to the active temperature controller via radio signals. The active temperature controller may be connected to a temperature control device, such as a heater or a fan, in any appropriate manner, including via wired connection or via radio signal.

In some embodiments, active temperature controller circuitry (which can be implemented with any kind of temperature detection, RTD-type or otherwise) is located in or integrated with at least one of the load board 112, the socket 101, a TU, and/or is located near the second side of the DUT 106 (such as active temperature controller circuitry integrated with a TU facing the second side of the DUT 106). In some embodiments, the active temperature controller engages with the socket 101 by active temperature controller contacts that mate with the socket 101. The active circuitry can be configured to receive an input signal representative of a temperature, such as a voltage received from the RTD 116, and to output a signal representative of the temperature to the controller 114. This can reduce the number of signals needed to be sent to the controller 114, and can improve accuracy, as this may be performed by simply amplifying a received voltage signal.

FIG. 6A depicts a DUT inserted in a socket of a test system 100 with a multilayered floating plate 102, according to one embodiment. FIG. 6B depicts a DUT inserted in a socket of a test system 100 with a multilayered floating plate 102 having a heating/cooling slug 602 (e.g. a heat sink, or component thermally connected to a heat sink, used for heating or cooling), according to another embodiment. In the embodiments depicted in both FIG. 6A and FIG. 6B, the multilayer floating plate 102 is integrated with the RTD 116, but in other embodiments the floating plate need not include an RTD 116. In other embodiments, a temperature control element other than a heating/cooling slug may be disposed between the DUT 106 and the floating plate 102 or may be embedded in the floating plate, such as a flow of temperature controlled liquid and/or gas, which can help to provide socket side temperature control.

In the embodiment depicted in FIG. 6A, the RTD 116 is embedded in the multilayered floating plate 102. The RTD 116 can alternatively be disposed on a surface of the floating plate 102. The multilayered floating plate 102 can comprise printed circuit material. The multilayered floating plate 102 can also or alternatively comprise a thermally conductive metal core printed circuit board, or ceramic, which can be useful for temperature control and for transmitting heat to the embedded RTD 116 and/or to transmit heat to or from the DUT contacts 108. In alternative embodiments, the floating plate 102 comprises anodized aluminum and the RTD 116 or a trace of the RTD 116 is located at a bottom surface of the floating plate 102, such that the anodized aluminum provides thermal contact between the DUT contacts 108 and the RTD 116.

FIG. 6B depicts an embodiment of system 100 that is similar in some ways to the embodiment depicted in FIG. 6A, but further includes the heating/cooling slug 602. The heating/cooling slug 602 can be in direct contact with the socket side of the DUT 106, or near enough to the DUT 106 to deliver heating or cooling to a portion of the DUT 106 that is in need of temperature control. The heating/cooling slug 602 can be a low temperature heat sink. In other embodiments, as discussed above, another type of temperature control element can be used instead of or in addition to the heating/cooling slug 602, such as a flow of temperature-controlled liquid and/or gas. The temperature control element can be embedded in, or disposed on a surface of, the floating plate 102.

Figure 7:
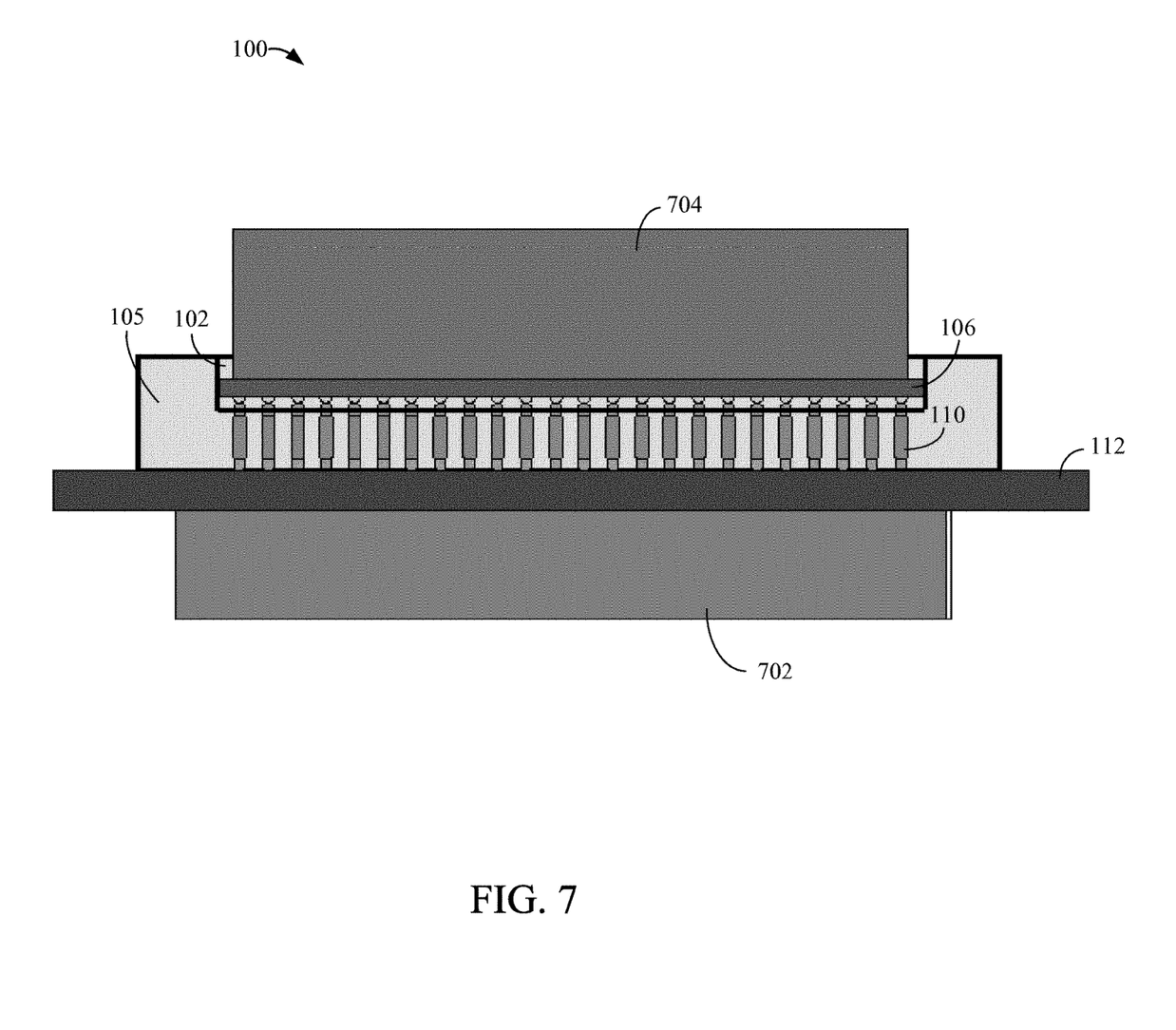
FIG. 7 depicts an embodiment of a system for testing IC devices having socket side thermal control via a load board, according to one embodiment.

FIG. 7 depicts an embodiment of temperature control implemented by delivering heat to, or disseminating or receiving heat from, the socket side of the DUT 106 through the load board 112. The temperature control in the depicted embodiment is implemented with a socket side thermal unit 702 and a second side thermal unit 704. The thermal units 702 and 704 are heat sinks, and each thermal unit can separately be either high-temperature, for delivering heat, or low-temperature, for receiving heat. In other embodiments, only one thermal unit may be implemented, or more than two thermal units may be implemented. In other embodiments, flow of temperature controlled air or direct contact with a thermally controlled material can be used for temperature control through the load board. Materials for the load board or the contacts of the socket electrical contacts 110 may be selected for good thermal conductance. For example, the contacts of the socket electrical contacts 110 may be pogo pins, elastomeric conductors, or metallic "fuzz buttons."

Figure 8:
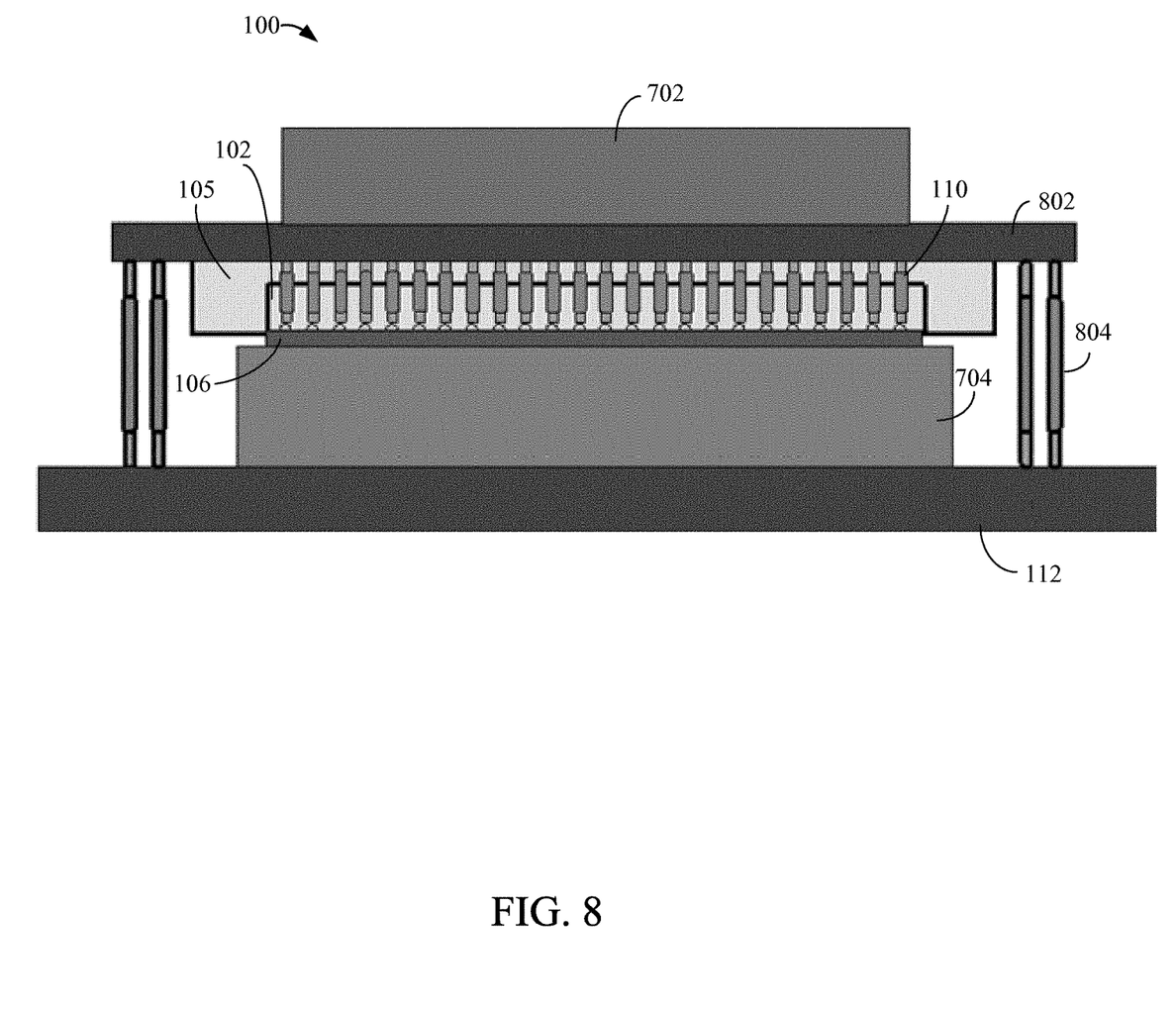
FIG. 8 depicts an embodiment of a system for testing IC devices having a thermally conductive substrate with thin film circuitry.

FIG. 8 depicts an embodiment of a system 100 in which a thermally conductive substrate 802 includes thin film circuitry configured to pass signals from a socket side of the DUT 106 to the load board 112. By providing a thermally conductive substrate 802 between the socket side thermal unit 702 and the socket side of the DUT 106, the socket side thermal unit 702 can have a more efficient thermal path towards the socket side of the DUT 106 than the configuration depicted in FIG. 7, because heat may transfer more easily through the thermally conductive substrate 802 than through the load board 112. However, in some embodiments a thermally conductive substrate may not be necessary, such as in embodiments in which the load board 112 comprises suitable thermally conductive materials, as discussed above.

The depicted embodiment of system 100 includes load board electrical contacts 804. The load board electrical contacts 804 can be any electrical contact between the thermally conductive substrate 802 and the load board 112, such as pogo pins. In this embodiment, the load board need not be close to the DUT 106 because it does not directly provide thermal control. The load board 112 is depicted in FIG. 8 as being below the DUT 106, but in other embodiments the load board need not be so positioned. The load board 112 may be positioned in any manner so as not to be a thermal impediment to heat transfer, for example, to the side of thermally conductive substrate 802.

In some embodiments, the load board electrical contacts 804 can be, for example, wires, pogo pins, "fuzz" buttons, or any other appropriate electrical connector. In yet other embodiments, no load board is used, or the thermally conductive substrate 802 may function as a load board and may be electrically connected to controller 114 directly. In some embodiments, a second side thermal unit 704, is implemented in conjunction with a thermal unit 702.

Testing of IC devices can be performed using the depicted system 100 in any appropriate manner. For example, some components, such as the thermally conductive substrate 802, the socket electrical contacts 110, and the thermal unit 702 can be pushed down as a unit on to the DUT 106.

Figure 9:
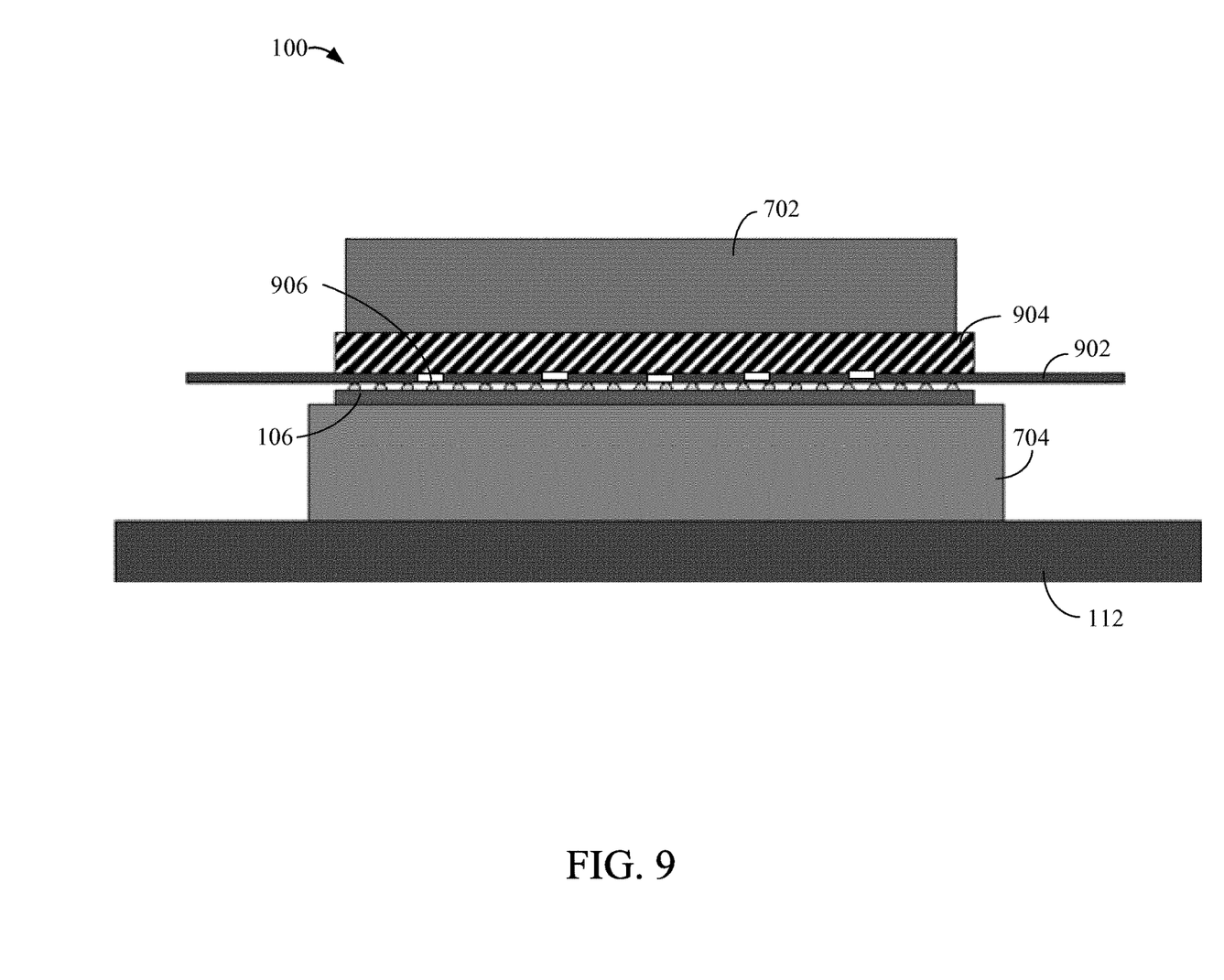
FIG. 9 depicts an embodiment of a system for testing IC devices that includes a flexible circuit board and a thermal interface.

FIG. 9 depicts an embodiment of a system 100 that includes a flexible circuit board 902, a thermal interface 904, and a thermal unit 702. This configuration allows for good thermal contact between the flexible circuit board 902 and the thermal unit 702. The thermal unit 702 may be any thermal unit, system or device, including any thermal system described herein, such as an active or passive temperature control. In the depicted embodiment, the thermal interface material 904 is a compliant or flexible layer of a thermal interface material, and the flexible circuit board 902 is a flexible printed circuit board. The flexible circuit board 902 includes thermal vias 906 that allow for better heat flow between the thermal unit 702 and the socket side of the DUT 106. In other embodiments, the flexible circuit board 902 does not include thermal vias, and the flexible circuit board may comprise thermally conductive material. The flexible circuit board 902 may be connected to the load board 112 (connection not shown) or may itself function as a load board 112. In some embodiments, a second side thermal unit 704 is implemented in conjunction with the depicted socket side thermal unit 702, and the second side thermal unit 704 is configured to receive the DUT 106. For example, the second side thermal unit 704 can include a recess for receiving the DUT 106.

The temperature control systems or methods described herein can be used in conjunction with the temperature measurement systems or methods described here, in any appropriate manner. For example, in one embodiment, an integrated circuit device testing system includes a socket configured to receive an integrated circuit device, and a thermal unit configured to heat and/or cool the integrated circuit device from beneath the integrated circuit device (from a socket side) while the integrated circuit device is engaged with the socket. The socket comprises at least one conductive trace made of a material with a resistivity that is a function of temperature, and the socket is configured such that, when the integrated circuit device is located in the socket, the at least one conductive trace extends along a surface of the integrated circuit device. The system further includes a controller or active circuit configured to determine a temperature at the surface of the integrated circuit device based on a measured resistance of the at least one conductive trace.

While the preferred embodiments of the devices and methods have been described in reference to the environment in which they were developed, they are merely illustrative of the principles of the inventions. Modification or combinations of the above-described assemblies, other embodiments, configurations, and methods for carrying out the invention, and variations of aspects of the invention that are obvious to those of skill in the art are intended to be within the scope of the claims.

What is claimed is:

1. An integrated circuit device testing system comprising:
   a socket configured to receive an integrated circuit device,
      wherein the socket comprises:
         a base member having a plurality of electrical contacts;

a circuit board supported by the base member via at least one spring, the circuit board having a plurality of openings configured to receive electrical contacts of the integrated circuit device and electrically engage with the electrical contacts of the base member through the openings of the circuit board; and at least one conductive trace positioned on or within the circuit board and extending around the plurality of openings of the circuit board to detect temperature of the integrated circuit device when the integrated circuit device is engaged with the electrical contacts of the base member, the conductive trace being made of a material with a resistivity that is a function of temperature; and a controller or active circuit configured to determine a temperature at the surface of the integrated circuit device based on a measured resistance of the at least one conductive trace while the integrated circuit device is engaged with the electrical contacts of the base member.

2. The integrated circuit device testing system of claim 1, wherein the circuit board comprises a flexible circuit board.

3. The integrated circuit device testing system of claim 1, wherein the at least one conductive trace is etched in the circuit board.

4. The integrated circuit device testing system of claim 1, wherein the conductive trace comprises copper.

5. The integrated circuit device testing system of claim 1, wherein the openings are arranged in columns corresponding to columns of electrical contacts of the integrated circuit device, and the at least one conductive trace is located between the columns of openings.

6. The integrated circuit device testing system of claim 1, wherein the circuit board is a multilayer structure that includes a metal core.

7. The integrated circuit device testing system of claim 1, wherein the circuit board is a multilayer structure comprising a ceramic material.

8. The integrated circuit device testing system of claim 1, wherein the circuit board comprises anodized aluminum or AlN.

9. The integrated circuit device testing system of claim 1, further comprising
a load board configured to electrically connect the at least one conductive trace to the controller.

10. The integrated circuit device testing system of claim 1, wherein the active circuit is located in a load board that is electrically connected to the at least one conductive trace.

11. The system of claim 1, wherein the at least one conductive trace is electrically connected to the controller or active circuit via a four wire Kelvin connection.

12. The integrated circuit device testing system of claim 1,
further comprising a thermal unit configured to heat and/or cool the integrated circuit device based on the detected temperature of the integrated circuit device.

* * * * *